(12) United States Patent
Yoon et al.

(10) Patent No.: US 6,245,490 B1
(45) Date of Patent: Jun. 12, 2001

(54) METHOD OF MANUFACTURING A CIRCUIT BOARD HAVING METAL BUMPS AND A SEMICONDUCTOR DEVICE PACKAGE COMPRISING THE SAME

(75) Inventors: Jin Hyun Yoon; Gi Bum Park, both of Cheonan; In Pyo Hong, Suwon; Yong Kim, Asan; Myung Kee Chung, Cheonan, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/506,593

(22) Filed: Feb. 18, 2000

Related U.S. Application Data

(62) Division of application No. 09/087,929, filed on Jun. 1, 1998, now Pat. No. 6,041,495.

(30) Foreign Application Priority Data

Jun. 24, 1997 (KR) ................................. 97-26708

(51) Int. Cl.[7] ..................... G03F 7/00; H01L 21/00
(52) U.S. Cl. ................ 430/318; 430/314; 430/319; 438/612
(58) Field of Search .......................... 430/314, 318, 430/319; 438/612

(56) References Cited

U.S. PATENT DOCUMENTS

| | | | |
|---|---|---|---|
| 4,857,671 | 8/1989 | Nakano et al. | 174/68.5 |
| 4,959,404 | 9/1990 | Ott | 524/267 |
| 4,959,900 | 10/1990 | Di Givry | 29/840 |
| 4,970,780 | 11/1990 | Suda et al. | 29/840 |
| 4,972,580 | 11/1990 | Nakamura | 29/840 |
| 4,991,286 | 2/1991 | Russo et al. | 29/840 |
| 5,418,186 | * 5/1995 | Park | 437/183 |
| 5,736,780 | 4/1998 | Murayama et al. | 257/673 |
| 5,789,815 | * 8/1998 | Tessier | 257/723 |

* cited by examiner

Primary Examiner—Mark F. Huff
Assistant Examiner—Nicole Barreca
(74) Attorney, Agent, or Firm—Jones Volentine, L.L.C.

(57) ABSTRACT

A first method of manufacturing a printed circuit board includes steps of (a) preparing a board which has a chip mounting area and circuit patterns on an upper surface and metal pads to be electrically connected to the circuit patterns on a lower surface, (b) attaching a metal plate to the lower surface of the board, (c) forming metal patterns on the metal pads by etching the metal plate, and (d) forming metal bumps by plating the metal patterns. A second method of manufacturing a circuit board, in this case a flexible circuit board, includes the steps of (a) preparing a board having Cu patterns, plated with a Au layer, attached to a lower surface of a polyimide tape, (b) forming a plurality of via holes in the polyimide tape, which expose the Cu patterns to the upper surface of the polyimide tape, (c) coating the upper surface of the polyimide tape with a photoresist, and exposing and developing the photoresist to form openings therein which expose the via holes, (d) plating walls, defining the openings and the via holes, with Cu, (e) removing remaining portions of the photoresist to produce Cu bumps, and (f) plating the bumps to protect the Cu. The printed circuit boards of the present invention have advantages in that they are not subject to a misalignment of the metal bumps with their underlying conductive pattern, and eliminate the need to use flux, thereby being environmentally friendly.

10 Claims, 12 Drawing Sheets

METHOD OF MANUFACTURING A CIRCUIT BOARD HAVING METAL BUMPS AND A SEMICONDUCTOR DEVICE PACKAGE COMPRISING THE SAME

CROSS REFERENCE TO RELATED APPLICATIONS

This is a divisional application of application Ser. No. 09/087,929, filed Jun. 1, 1998 now U.S. Pat. No. 6,041,495, which is hereby incorporated by reference in its entirety for all purposes.

BACKGROUND OF THE INVENTION

1. Field of the Invention

The present invention relates to methods of manufacturing the external connections of a circuit board, and to methods of manufacturing a semiconductor device package comprising a circuit board having such external connections. More particularly, the present invention relates to methods of manufacturing a circuit board having metal bumps as its external connections, and to methods of manufacturing a semiconductor device package comprising the same.

2. Description of the Related Art

Semiconductor device packages are progressively becoming faster, smaller, and thinner in order to meet the pressing demands for the miniaturization and multi-functionalization of electronic apparatus. A Ball Grid Array Package (hereinafter, referred to as a 'BGA package') has been developed in connection with these trends. The BGA package is a type of surface mount package which uses a printed circuit board (PCB) and solder balls or solder bumps, instead of a lead frame, for electrically connecting the semiconductor chip and the main circuit board. The BGA package has a comparatively large number of the I/O pins, and thus possesses a high mounting density.

As mentioned above, the BGA package has a structure in which the semiconductor chip is attached and electrically connected to the PCB. Also, circuit wiring patterns formed on a surface of the PCB, to which the semiconductor chip is attached, are electrically connected to external connections formed on the other surface of the PCB through a plurality of via holes. Because the external connections are not formed on the surface to which the semiconductor chip is attached, the BGA package can have a mounting area, i.e., an area over which the BGA package is mounted to the main board, that is smaller than that of other conventional plastic packages. In conventional BGA packages, solder bumps are used as the external connections.

FIG. 1 depicts such a conventional BGA package. The BGA package 200 includes a semiconductor chip 130 which is electrically connected to solder bumps 128. A PCB 110 is positioned between the semiconductor chip 130 and the solder bumps 128 and is used as a means for connecting the semiconductor chip 130 and the solder bumps 128.

A copper (Cu) pattern layer is formed on upper and lower surfaces of the PCB 110 so as to facilitate the electrical connection of the semiconductor chip 130 to the solder bumps 128. A plurality of via holes 124 are formed in the PCB 110 in order to interconnect the Cu pattern layers which are deposited on the upper and the lower surfaces of the PCB 110. In addition, Cu forms the inner walls of the via holes 124.

The Cu pattern layer on the upper surface of the PCB 110 forms a chip mounting area 132 and circuit patterns 123. The chip mounting area 132 is the region on which the semiconductor chip 130 will be mounted. The respective circuit patterns 123 are positioned around the chip mounting area 132. One end of each circuit pattern 123 serves as a wire bonding area 125 which is electrically connected to the semiconductor chip 130 by a bonding wire 134.

The Cu pattern layer on the lower surface of the PCB 110 consists of a plurality of solder ball pads 126. The solder ball pads 126 are made of a metal, and solder balls will be attached thereto. The via holes 127 which are formed below the chip mounting area 132 are for transferring the heat generated during the operation of the semiconductor chip 130 to the outside. Hereinafter, these via holes 127 will be referred to as 'the emission via holes' 127.

Before electrically connecting the semiconductor chip 130 to the PCB 110 with the bonding wires 134, the upper and the lower surfaces of the PCB 110 are coated with solder resist 120. The solder resist 120 is applied over all portions of the upper and lower surfaces except for the chip mounting area 132, the wire bonding area 125, and the area of the solder ball pads 126. After that, the upper surface of the PCB 110 is encapsulated with thermosetting resin to protect the semiconductor chip 130 and the circuit patterns 123. This encapsulant results in the formation of a package body 136. The solder balls are attached to the solder ball pads 126 on the lower surface of the PCB 110 to thereby form the solder bumps 128.

FIG. 2A depicts a step of a screen printing method in which the PCB is coated with flux by using a metal mask. FIG. 2B depicts a step of attaching the solder balls to the flux.

With reference to these figures, a screen printing method for forming the solder bumps 128 will now be described. Generally, after the PCB 110 is turned over so that the lower surface on which the solder ball pads 126 are formed faces upwards, the solder balls 128 are attached to the solder ball pads 126. More specifically, a metal mask 150 in which holes 154 are formed in a pattern corresponding to that of the solder ball pads 126 is placed on the PCB 110. Then, flux 140 is supplied onto the metal mask 150 and is forced through the holes 154 using a squeegee 156. Next, solder supplied to the metal mask 150 forms solder balls which attach to the flux 140.

The solder bumps 128 are produced by using a reflow soldering process, which is carried out under a temperature of 230° C. or more. In this process, solder balls are attached to the solder ball pads 126.

After the reflow soldering process is carried out, the residue of the flux 140 which remains around the solder bumps 128 may contaminate the PCB 110, and disrupt the subsequent manufacturing processes. Therefore, it is necessary to remove the residue of the flux 140 with an organic solvent. Note, the main component of the flux 140 is a rosin.

As the number of the solder ball pads 126 increases, the pitch between the solder ball pads becomes smaller, and it becomes accordingly more difficult to align the solder balls exactly with the solder ball pads 126 using the metal mask 150. Furthermore, because the solder balls are attached to the solder ball pads 126 by the reflow soldering process, it is difficult to produce solder bumps 128 having a uniform height.

In addition, the organic solvent, which is used for removing the rosin component of the flux 140, is harmful to the environment. Another problem is that the small pitch between the solder ball pads 126 is oftentimes responsible for failures, such as shorts between adjacent solder balls. In other words, the adjacent solder bumps 128 adhere to each other causing a short between the solder bumps 128.

Also, among the semiconductor device packages which use the solder bumps as electrical connections, a micro BGA package (hereinafter, referred to as a 'μ-BGA package') developed by Tessera Co. (U.S.) has a problem in that the small size and pitch of the via holes of a polyimide tape, which is attached to the solder balls, can cause misalignment of the solder balls. Note also that the ratio of the height of the solder bumps to the thickness of the μ-BGA package is very large, that is, the height of the solder bumps is 300~350 μm for a μ-BGA package having a thickness of 784~847 μm.

SUMMARY OF THE INVENTION

Accordingly, an object of the present invention is to provide methods of manufacturing a printed circuit board having metal bumps as external means of connections and to provide methods of manufacturing a semiconductor device package using the same, in which the aligning of the metal bumps with their underlying conductive pattern is not problematic.

Another object of the present invention is to provide methods of manufacturing a printed circuit board having metal bumps and to provide methods of manufacturing a semiconductor device package using the same, which do not require the use of flux and are therefore safer for the environment.

Still another object of the present invention is to provide methods of manufacturing a printed circuit board and to provide methods of manufacturing a semiconductor device package using the same, which produce external connections of the PCB having a high degree of uniformity in their height.

The present invention achieves the foregoing objects by providing a method of manufacturing a printed circuit board in which a metal plate is etched to form the metal bumps. This metal plate is present on a surface of the printed circuit board opposite that to which the semiconductor chip will be attached.

The present invention also achieves the foregoing objects by providing a method of manufacturing a printed circuit board in which holes in a polyimide film coated with a photoresist are filled with metal, and the photoresist is then removed to leave metal bumps projecting from the film. These bumps are electroplated to form the electrical connections on a surface of the circuit board opposite to that to which a semiconductor chip will be attached.

BRIEF DESCRIPTION OF THE DRAWINGS

These and various other features and advantages of the present invention will be described with reference to the accompanying drawings, wherein like reference numerals designate like structural elements, and, in which.

DETAILED DESCRIPTION OF THE PREFERRED EMBODIMENTS

Figure 3:
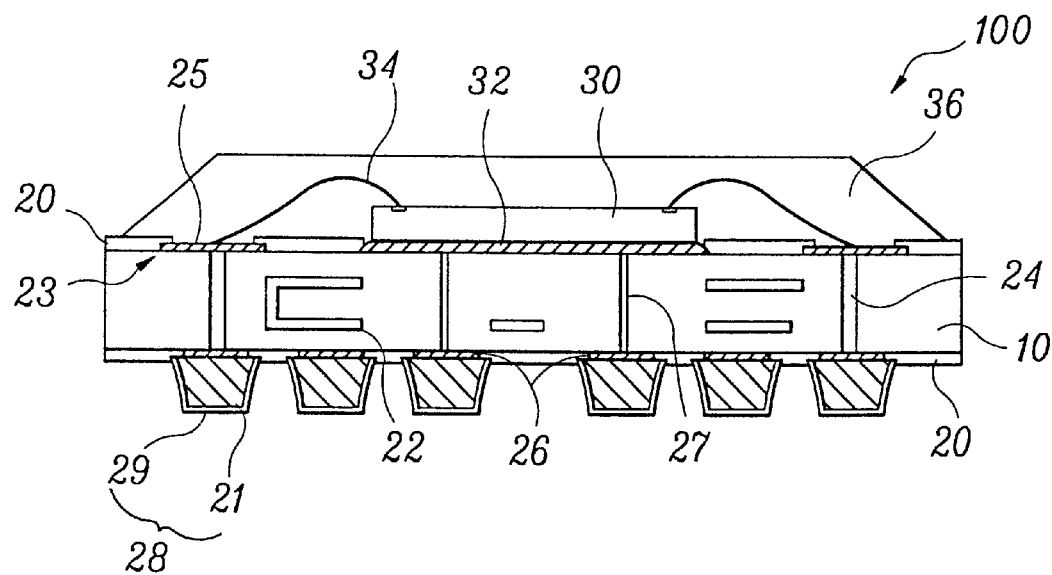
FIG. 3 is a cross-sectional view of a semiconductor device package produced according to an embodiment of a manufacturing method of the present invention.

Referring first to FIG. 3, a semiconductor device package 100 comprises a semiconductor chip 30, metal bumps 28 which are used as external connections, a printed circuit board (hereinafter, referred to as a 'PCB') 10, and an encapsulant 36. The semiconductor chip 30 and the metal bumps 28 are attached to upper and lower surfaces of the PCB 10, respectively. Inner connection layers 22 for electrically connecting the semiconductor chip 30 to the metal bumps 28 are formed on the inside of the PCB 10.

A chip mounting area 32, where the semiconductor chip 30 will be mounted, is formed on the upper surface of the PCB 10. Circuit patterns 23 are provided around the chip mounting area 32 on the upper surface of the PCB 10. Metal pads 26 to which metal bumps 28 will be attached are formed on the lower surface of the PCB 10. The circuit patterns 23 and the metal pads 26 are electrically interconnected by signal via holes 24 which pass through the PCB 10 and inner connection layers 22. Respective ends of the circuit patterns 23 on the upper surface of the PCB 10 serve as wire-bonding areas 25 which are electrically connected to the semiconductor chip 30 by bonding wires 34.

The upper and the lower surfaces of the PCB 10 are coated with solder resist 20. At this time, the solder resist 20 is applied over all portions of the surfaces of the PCB 10 except the chip mounting area 32 and the wire-bonding area 25 of the upper surface, and except on the metal bumps 28 on the lower surface.

The upper surface of the PCB 10 and the semiconductor chip 30 are encapsulated with a thermosetting resin in order to protect the semiconductor chip 30 which is mounted on the chip mounting area 32, the circuit patterns 23, and the bonding wires 34. The encapsulant 36 forms a package body.

Each metal bump 28 consists of a pattern part 21 which is formed by the etching of a Cu plate, and a plate layer 29 which is formed by plating the Cu with solder or Ni/Au alloy in order to assure that the metal bump 28 can be reliably mounted to an external connection of an electronic appliance.

Next, reference will be made to FIG. 4A through FIG. 4G showing a process for attaching the metal bumps 28 of the present invention to the metal pads 26 of the PCB.

The PCB 10 comprises a BT resin (Bismaleimide Triazine Resin) layer or a prepreg layer, and a Cu pattern layer. The Cu pattern layer is for electrically connecting the semiconductor chip to the metal bumps, and has a four-layered structure, that is, respective layers on the upper and the lower surfaces of the PCB 10, and two layers on the inside of the PCB 10. The Cu pattern layer on the lower surface of the PCB 10 forms the chip mounting area 32 and the circuit patterns 23 which are located around the chip mounting area 32. One end of each respective circuit pattern 23 serves as a wire-bonding area 25 which is electrically connected to the semiconductor chip 30 by bonding wires (not shown). The metal pads 26 to which the metal bumps are attached are formed on the upper surface of the PCB 10.

The circuit patterns 23 on the lower surface and the metal pads 26 on the upper surface are connected to each other by the signal via holes 24 and the inner connection layers 22 which are formed on the inside of the PCB 10. Further, emission via holes 27 are formed under the chip mounting area 32 in order to vent the heat generated from the semiconductor chip 30.

Figure 4A:
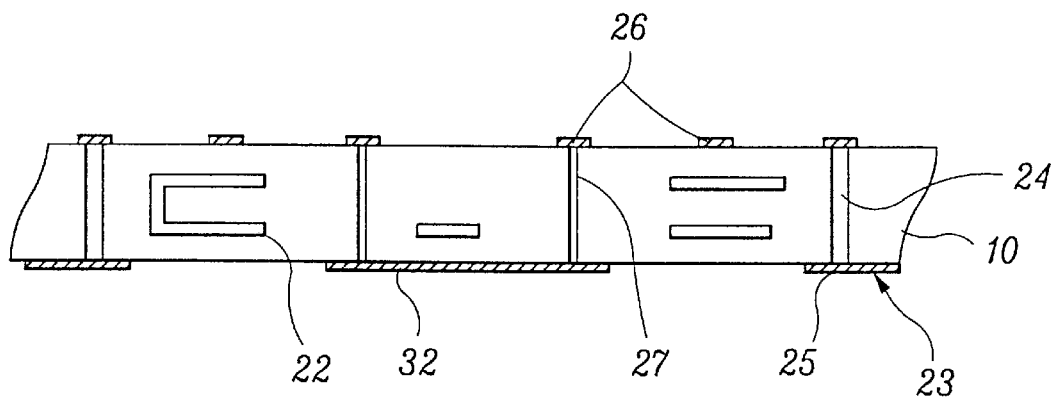
FIG. 4A is a cross-sectional view of an intermediate product of a PCB which has circuit patterns formed on its upper and lower surfaces, the PCB being manufactured according to the present invention and used in the package shown in FIG. 3.
Figure 4B:
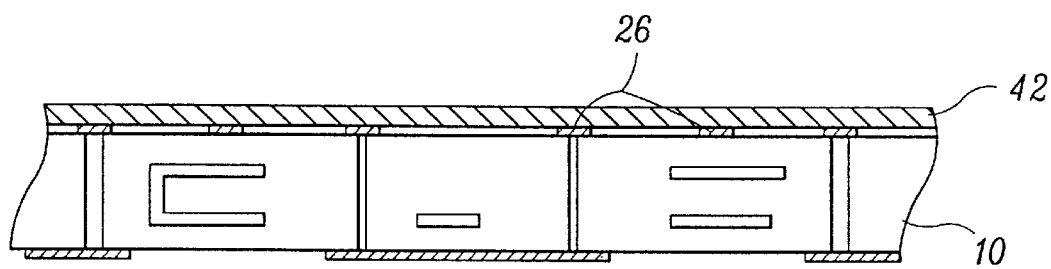
FIG. 4B is a cross-sectional view of FIG. 4A, depicting the attaching of a metal plate to the upper surface of the PCB according to the present invention.

After the PCB 10 is prepared as described above, a metal plate 42 is attached to the upper surface of the PCB 10 by a thermocompression process, as shown in FIG. 4B. Although the thickness of the metal plate 42 is typically the same as the height of the solder bumps of the BGA package, it can vary depending on the pitch of the metal pads 26. The thickness of the metal plate 42 of the present invention is 0.2~0.8 mm and a Cu plate is used as the metal plate 42.

Figure 4C:
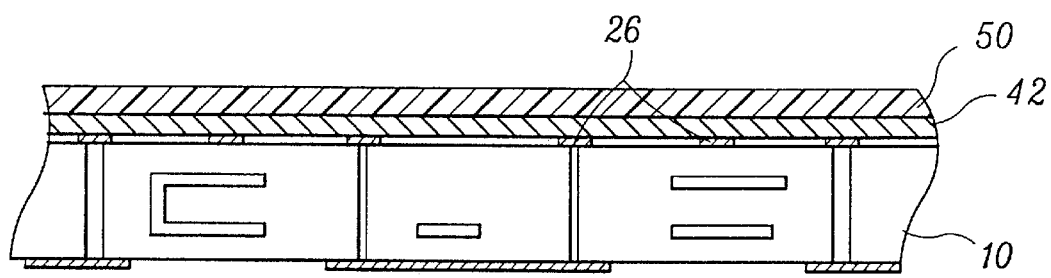
FIG. 4C is a cross-sectional view of FIG. 4B, depicting the coating of the upper surface of the metal plate with a photoresist according to the present invention.

After the Cu plate 42 is attached to the upper surface of the PCB 10, a photoresist 50 is applied to the upper surface of Cu plate and is used to form the pattern of metal bumps as shown in FIG. 4C.

Figure 4D:
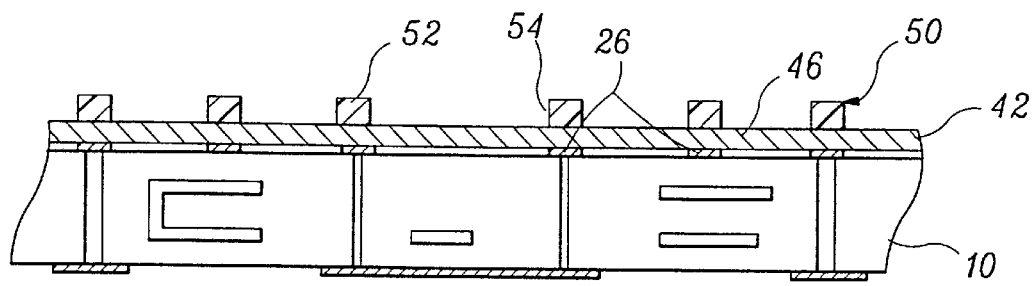
FIG. 4D is a cross-sectional view of FIG. 4C, depicting the photoresist after being developed according to the present invention.

After that, as shown in FIG. 4D, parts of the photoresist 50, other than those parts 52 which are aligned with the metal pads 26, are exposed, developed and removed. The remaining portions 52 of the photoresist 50 are used as a mask in the etching of the metal plate 42.

Figure 4E:
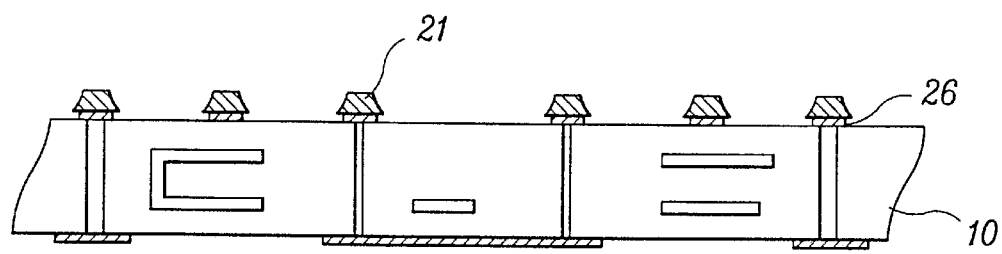
FIG. 4E is a cross-sectional view of FIG. 4D, depicting the patterning of the metal plate on the metal pads after the developing of the photoresist according to the present invention.

That is, portions of the metal plate 46 exposed in the openings 54 of the photoresist 50 are removed by etching. After the etching process is completed, the portions 52 of the photoresist 50 are removed from of the PCB. Then, as shown in FIG. 4E, only the pattern parts 21 of the metal plate 46 are left on the upper surfaces of the metal pads 26. The metal plate 46 is etched using a wet etching method with chemicals such as $H_2SO_4$, $H_3PO_4$, HF, HCl, or $NH_4OH$ et al. A dry etching method could also be used, however it has a disadvantage in that it is a relatively time-consuming process.

Figure 4F:
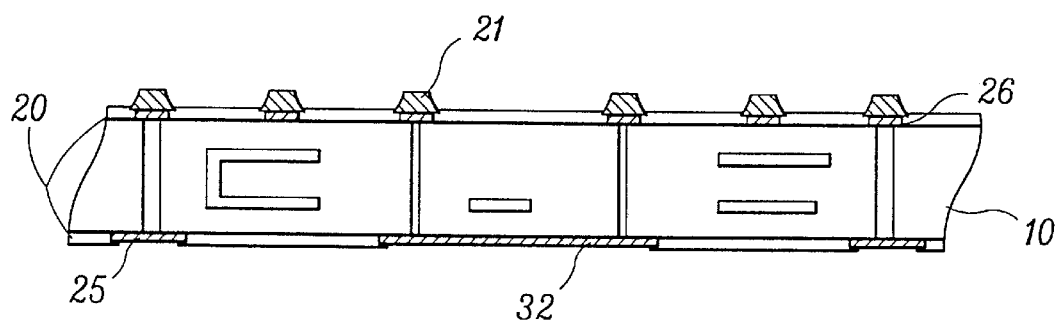
FIG. 4F is a cross-sectional view of FIG. 4E, depicting the coating of solder resist on the PCB according to the present invention.
Figure 4G:
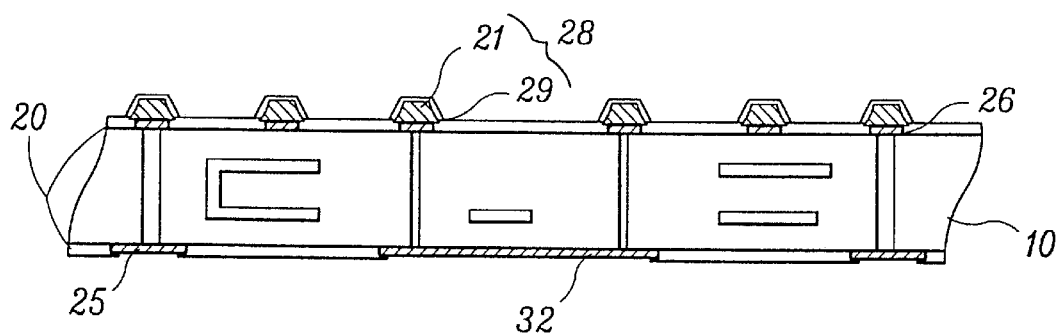
FIG. 4G is a cross-sectional view of the PCB, depicting the plating of the metal bumps according to the present invention.

After the pattern parts 21 are formed, the upper and the lower surfaces of the PCB 10 are coated with solder resist 20 as shown in FIG. 4F. The solder resist 20 is applied over all portions of the surfaces of the PCB except at the pattern parts 21 of the upper surface, and over the chip mounting area 32 and the wire-bonding area 25 of the lower surface. Because the pattern parts 21 are made of Cu, a plating layer 29 of solder or Ni/Au alloys is provided on the pattern parts 21 to protect them from oxidation and to improve the ability of the bumps to be mounted to external electronics. Here, the thickness of the plating layer 29 is 5.08~25.4 μm. FIG. 4G depicts the plating of the pattern parts 21 with the plating layer 29 to form the metal bumps 28 on the metal pads 26.

Figure 5:
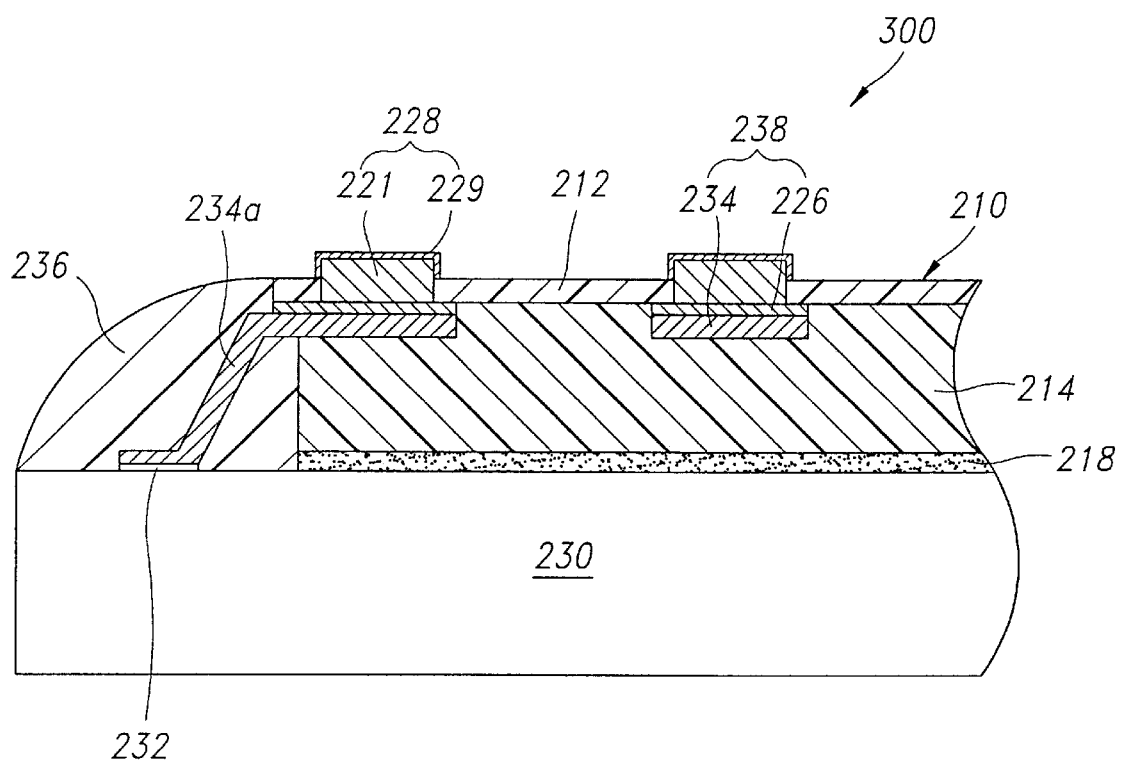
FIG. 5 is a cross-sectional view of a portion of a semiconductor device package comprising a flexible circuit board, plated bumps of the circuit board being formed according to the second embodiment of a manufacturing method of the present invention.

FIG. 5 shows another embodiment of a semiconductor device package according to the present invention.

Referring to FIG. 5, a semiconductor device package 300 comprises a semiconductor chip 230, and a flexible circuit board 210 on which a plurality of plated bumps 228 are formed. The semiconductor chip 230 is mounted on the lower surface of the flexible circuit board 210 and the plated bumps 228 are formed at the upper surface of the flexible circuit board 210. Cu patterns 238 for electrically connecting the semiconductor chip 230 to the plated bumps 228 are attached to the lower surface of the plated bumps 228. A package body 236 is formed by encapsulating the electrical connections and the semiconductor chip 230.

A plurality of chip pads 232 of the semiconductor chip 230 are electrically connected to the flexible circuit board 210 on which the plated bumps 228 are formed. The flexible circuit board 210 includes a polyimide film 212 in which a plurality of via holes (not shown) are formed and the Cu patterns 238 which are plated with gold (Au). The flexible circuit board 210 is attached to the upper surface of the semiconductor chip 230 with an adhesive 218, with an elastomer layer 214 being provided under the flexible circuit board 210. The Cu patterns 238 are electrically connected to the via holes and the plating bumps 228 which project from the upper surface of the polyimide tape 212. A metal lead 234a, having the shape of a ribbon, electrically interconnects the chip pads 232 of the semiconductor chip 230 with the Cu layer 226 of the flexible circuit board 210. These interconnections are made by using a bonding method which is similar to a TAB (Tape Automated Bonding) method. After the bonding method is carried out, the exposed portion of the upper surface of the semiconductor chip 230 and the metal leads 234a are encapsulated with silicon resin in order to form the package body 236.

The above-described semiconductor device package 300 has the same size as or is slightly larger than the semiconductor chip 230. Therefore, this package 300 can have a small inductance and can be used in processing devices requiring high speed. Such a semiconductor device package 300 is referred to as a 'Chip Scale Package or a Chip Sized Package (CSP)'.

Figure 1:
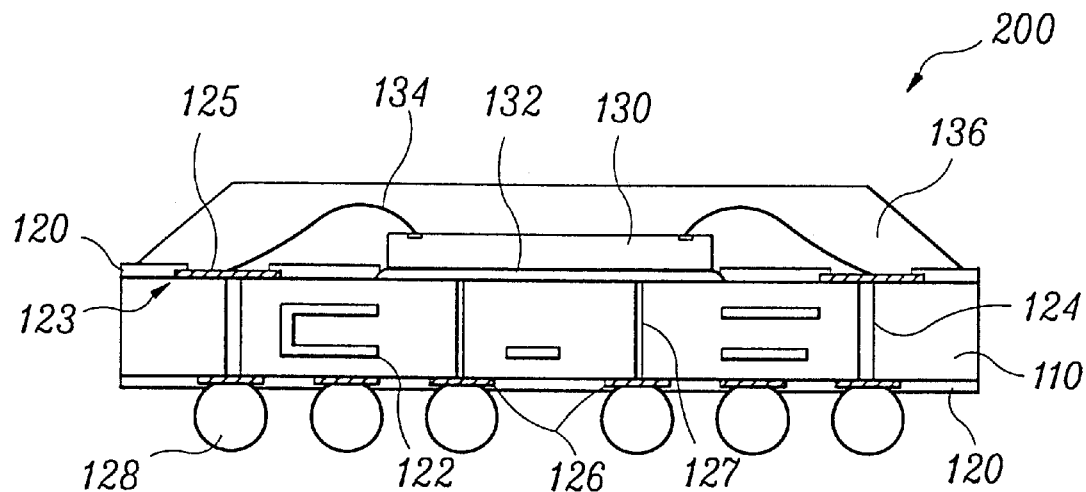
FIG. 1 is a cross-sectional view of a conventional BGA package.
Figure 2A:
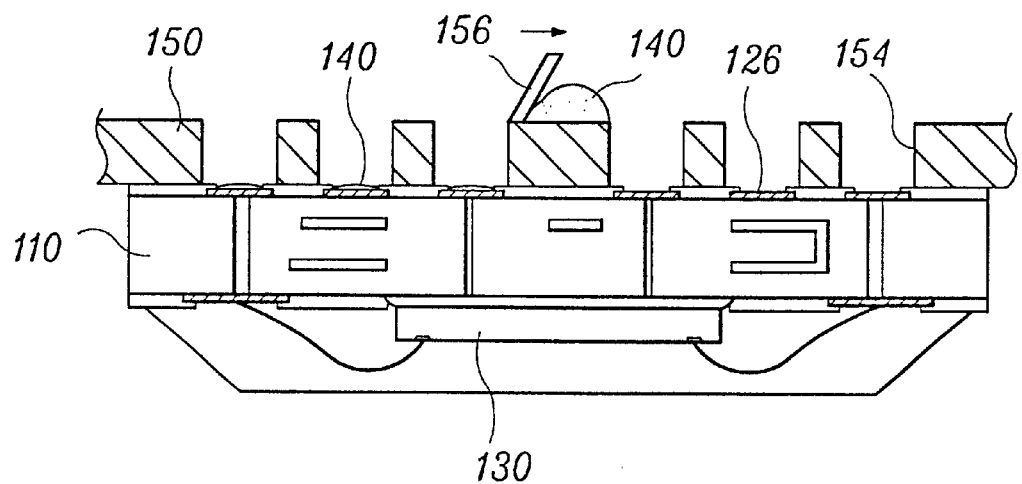
FIG. 2A is a cross-sectional view of an intermediate product of the conventional BGA package, depicting the coating of the PCB of the package with flux.
Figure 2B:
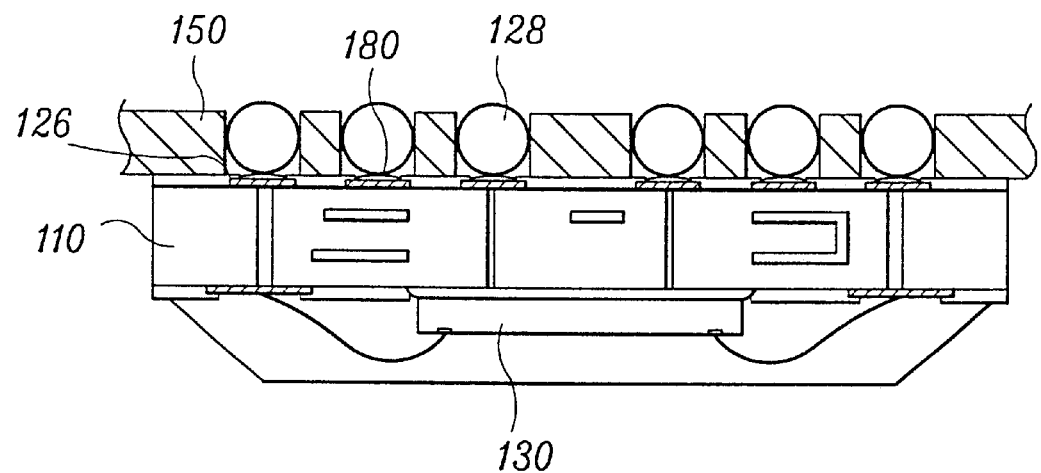
FIG. 2B is a cross-sectional similar to FIG. 2A but depicting the attaching of solder balls to solder ball pads which have been coated with the flux.

The plated bumps 228 are formed by plating outer surfaces of Cu bumps 221 with Ni and Au layers 229 in that order. Because the formation of the bumps 228 is completed by plating steps, the height of the plated bumps 228 is more uniform than that of the conventional solder bumps 128 formed by using the solder balls (FIG. 1). Whereas the solder bumps 128 in FIG. 1 are hemispherical, the plated bumps 228 of the present invention are cylindrical.

FIG. 6A through FIG. 6H depict a process of manufacturing the flexible circuit board.

Figure 6A:
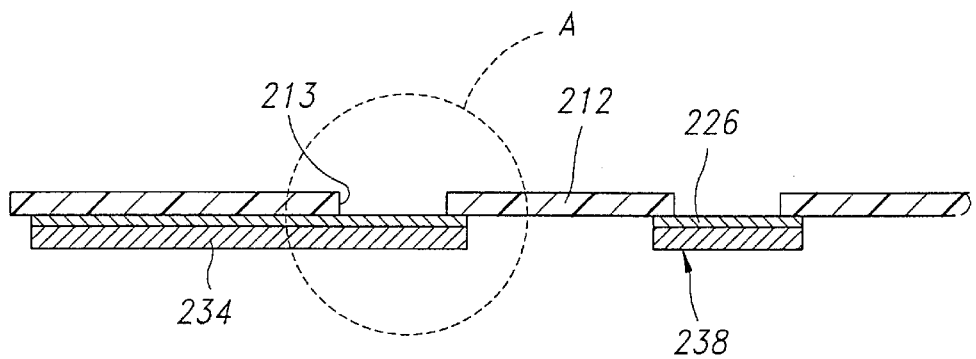
FIG. 6A through FIG. 6H are each a cross-sectional view of an intermediate product of the flexible circuit board, and together depict the second embodiment of a method of manufacturing the flexible circuit board according to the present invention.
Figure 6B:
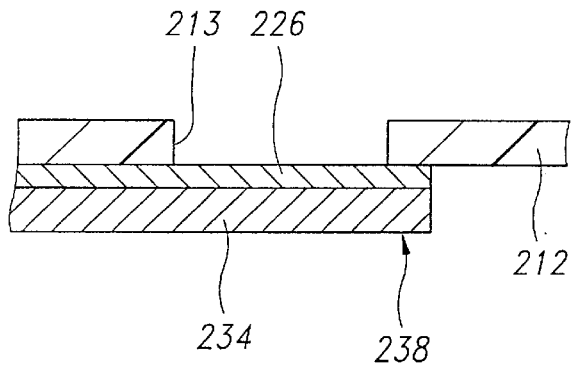

Referring first to FIG. 6A and FIG. 6B, an intermediate product of the flexible circuit board is formed. A Cu layer 226 is formed on the bottom surface of a polyimide tape 212. The Cu layer 226 is plated with Au layer 234 to form the Cu patterns 238. Then, a plurality of via holes 213 are drilled in the polyimide tape 212 in order to facilitate the formation of the plated bumps directly on the Cu patterns 238. At this time, the upper surfaces of the Cu patterns 238 are exposed through the via holes. The thickness of the Cu layer 226, which is electroplated on the lower surface of the polyimide tape 212, is 10 μm and the thickness of the Au layer 234, which is electroplated on the lower surface of the Cu layer 226, is 20~25 μm. The thickness of the polyimide tape 212 itself is 20~25 μm.

Figure 6C:
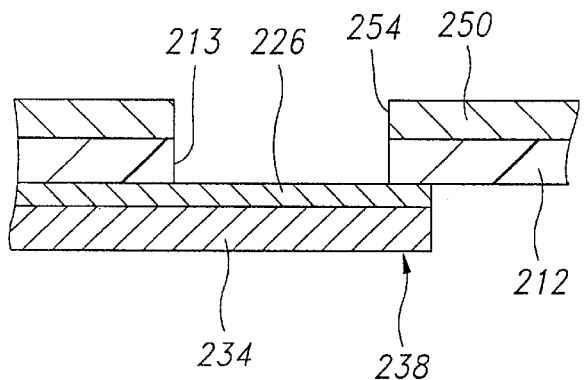
Figure 6D:
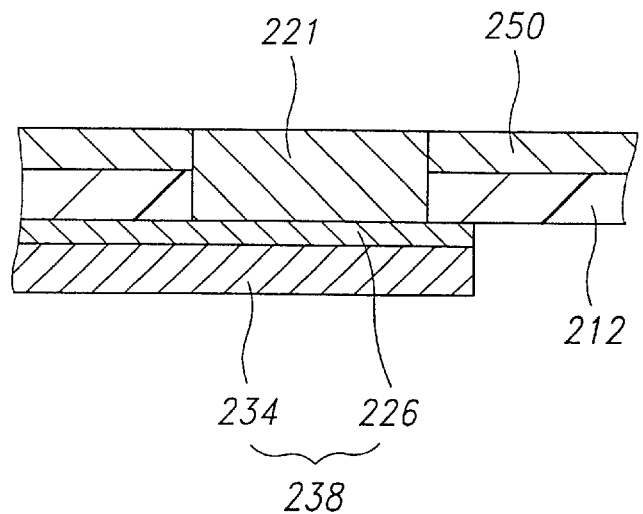

FIG. 6C and FIG. 6D show the steps used for forming the plated bumps in the via holes 213 of the polyimide tape 212. That is, after the upper surface of the polyimide tape 212 is coated with a photoresist 250 having a thickness of 50~100 μm, the photoresist is exposed and developed to form holes 254. After that, the exposed upper surface of the Cu layer 226 is electroplated with Cu through the via holes 213 of the polyimide tape 212 and the openings 254 of the photoresist 250. After completing the electroplating of the Cu layer 226 to form the Cu bumps 221, the photoresist 250 is removed. That is, the photoresist 250 is used as the mask for plating the exposed upper surface of the Cu layer 226.

Figure 6E:
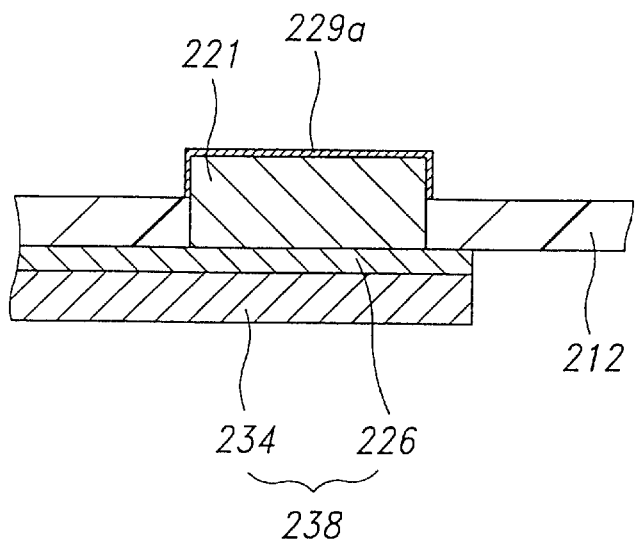
Figure 6F:
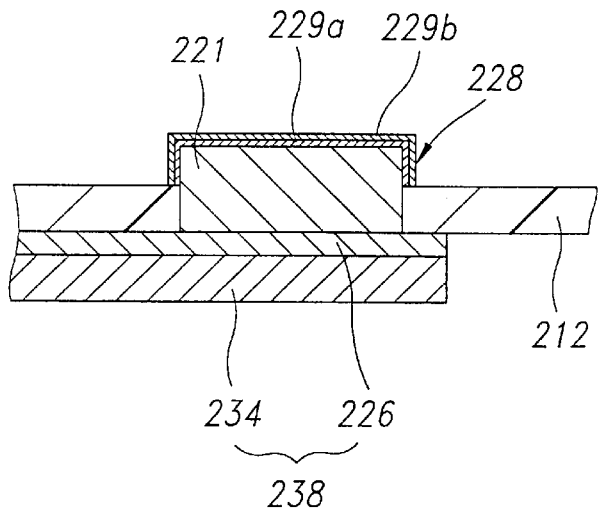

The outer surfaces of the Cu bumps 221 which project from the polyimide tape 212 are plated with Ni to form Ni layers 229a each having a thickness of 5~15 μm as shown in FIG. 6E. The outer surfaces of the Ni layers 229a are plated with Au to form Au layers 229b each having a thickness of 1~5 μm, as shown in FIG. 6F. Accordingly, the plated bumps 228 are formed on the polyimide tape 212.

Figure 6G:
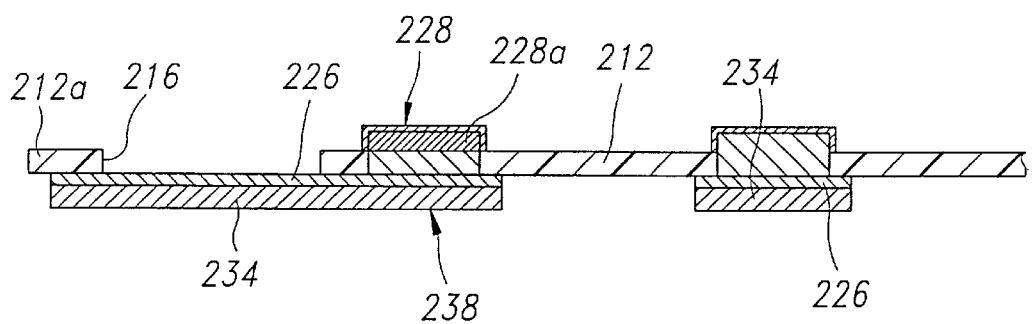
Figure 6H:
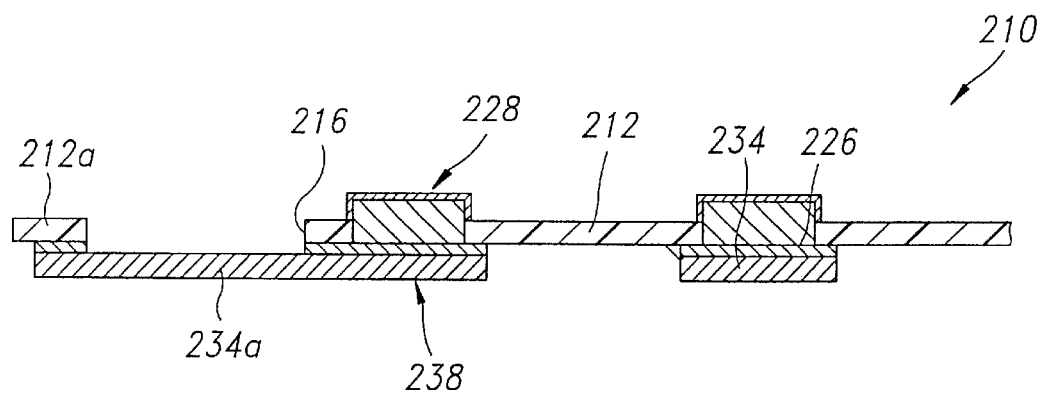

As shown in FIG. 6G and FIG. 6H, openings 216 are formed by etching an outer part of the polyimide tape 212 and those parts of the Cu layer 226 which are disposed under the outer part of the polyimide tape 212. These openings 216 expose outer portions of the Au layer 234 of the Cu patterns 238 which are used to form the metal leads 234a. These are the metal leads that will be connected to the chip pads of the semiconductor chip. In order to support the ribbon-shaped metal leads 234a which are exposed by the openings 216, the outmost edges of the polyimide tape hereinafter, referred to as 'lead support portions' 212a) are left, i.e., are not etched away. Hence, the flexible circuit board 210 is formed.

Because the height of the plated bumps 228 of the present invention will be proportional to the thickness of the photoresist 250 (FIG. 6D), the height of the projecting parts 228a of the plated bumps 228 (those parts which project from the upper surface of the polyimide tape 212) can be made 50 μm or less by controlling the thickness of the photoresist 250 to be 50 μm or less.

A method of manufacturing the semiconductor device package 300 using the flexible circuit board 210 having the above-described plated bumps 228 will be described with reference to FIG. 5, and FIGS. 7A through 7E.

Figure 7A:
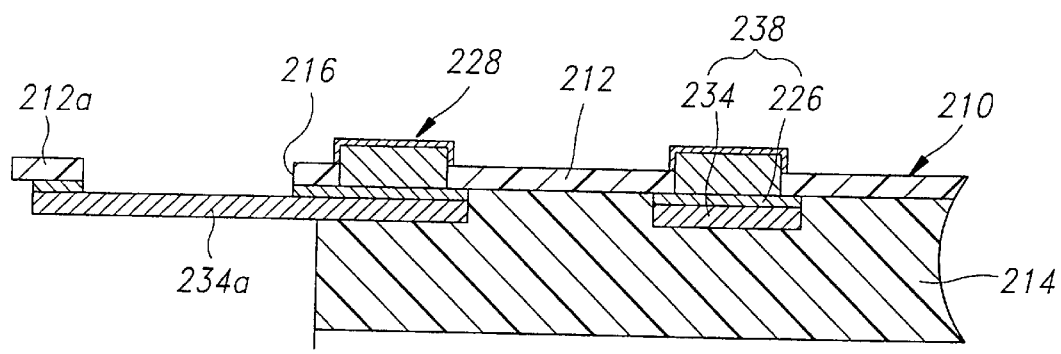
FIG. 7A through FIG. 7E are each a cross-sectional view of an intermediate product of the semiconductor device package shown in FIG. 5, and together depict the steps of the present invention of attaching the flexible circuit board on which the plated bumps are formed to a semiconductor chip.

Referring first to FIG. 7A, after the flexible circuit board 210 is prepared, the elastomer layer 214 is screen-printed on the lower surface of the flexible circuit board 210 but not on the metal leads 234a.

Figure 7B:
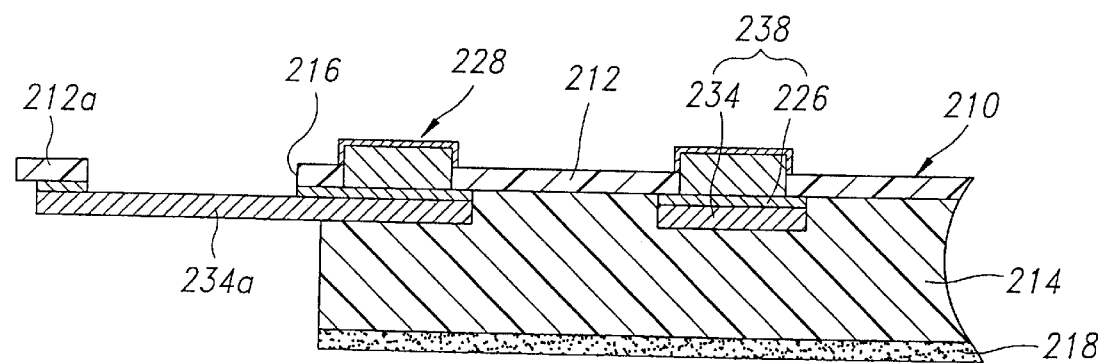
Figure 7C:
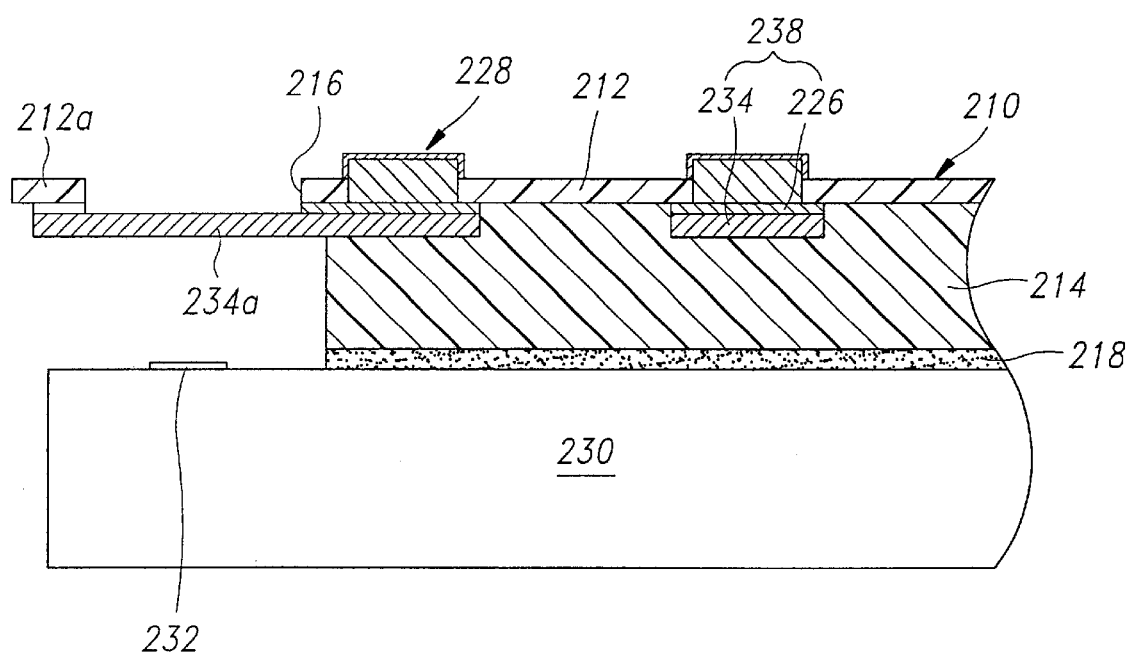

After the lower surface of the elastomer layer 214 is coated with adhesive 218, as shown in FIG. 7B and FIG. 7C, the flexible circuit board 210 is attached to the semiconductor chip 230. Specifically, the surface of the semiconductor chip 230, on which chip pads 232 are formed, is attached to the lower surface of the adhesive 218. Because the chip pads 232 are formed at the periphery of the active upper surface of the semiconductor chip 230, the chip pads 232 remain spaced from the lower surface of the adhesive 218.

Figure 7D:
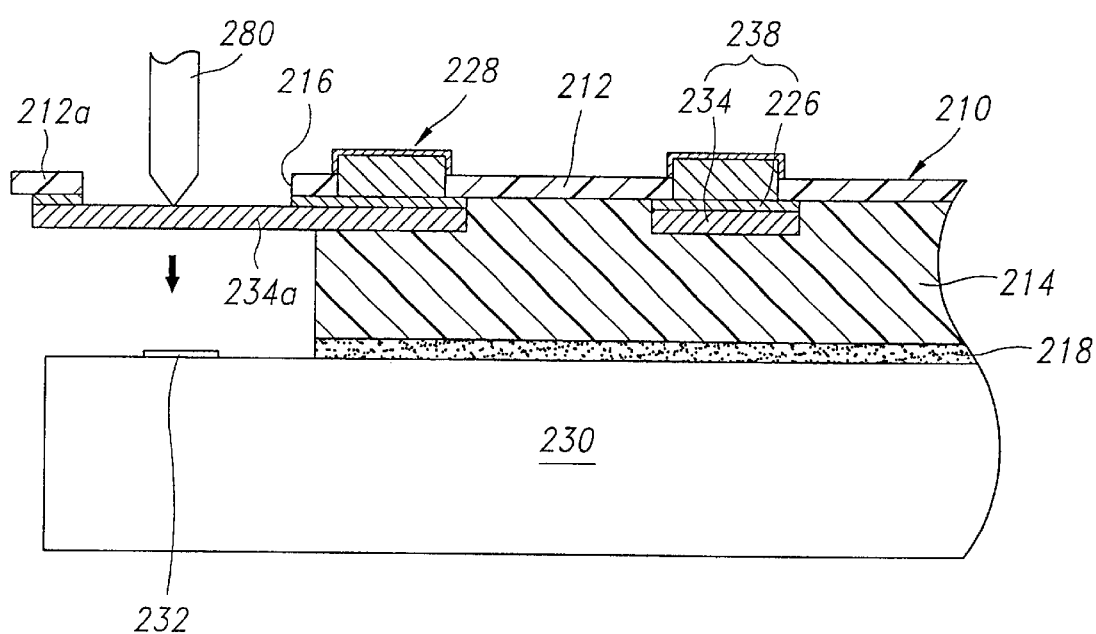
Figure 7E:
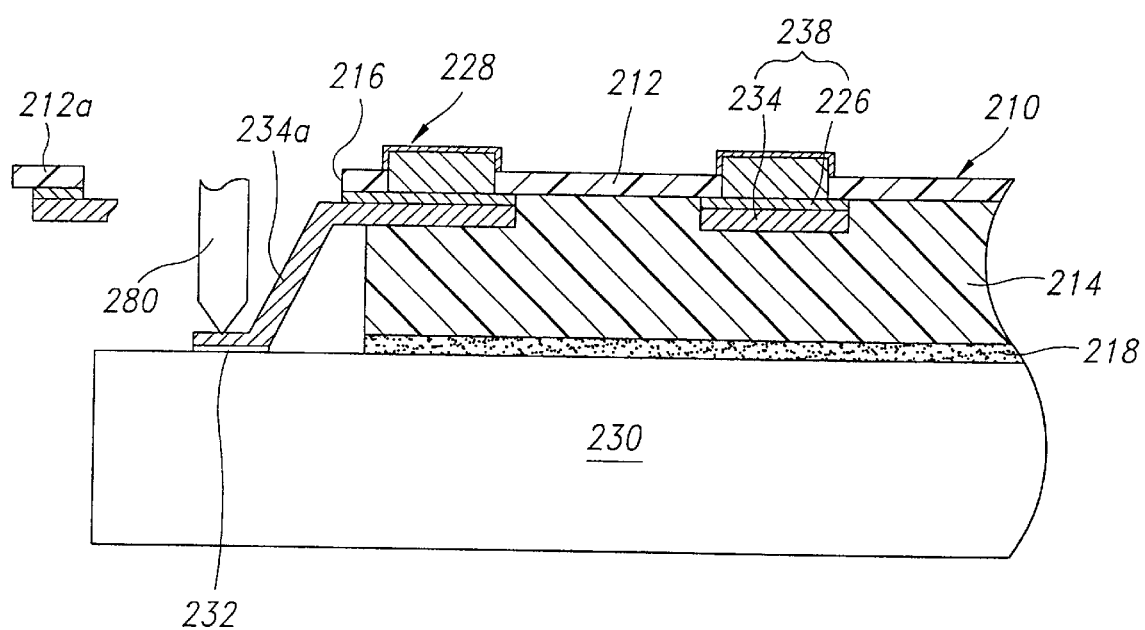

Then, as shown in FIG. 7D and FIG. 7E, the chip pads 232 are connected to the metal leads 234a by cutting the metal leads 234a adjacent the lead support portions 212a with a bonding tool 280 which is inserted through the openings 216 where the metal leads 234a are exposed. Thus, the method of bonding the metal leads 234a and the chip pads 232 is similar to the TAB bonding method.

After the chip pads 232 of the semiconductor chip 230 are bonded to the metal leads 234a, the exposed upper surface of the semiconductor chip 230 and the metal leads 234a are encapsulated with the silicon resin to form the package body 236. Thus, the manufacturing of the semiconductor device package 300 is completed.

In summary, in the first embodiment of the semiconductor device package according to the present invention, the metal bumps are formed by etching a metal plate while using a photoresist as a mask. The metal plate is attached to the upper surface of the metal pads of the printed circuit board. Because the process of forming the metal bumps does not require the use of flux, the problems in the prior art associated with removing rosin (the main component of the flux) and with the reflow soldering process, are overcome. Further, because the metal bumps are formed by a patterning method in which the height of the metal plate can be precisely controlled, the height of the metal bumps can be made uniform. Also, the metal bumps can be spaced at a smaller pitch than other conventional solder bumps, as a result of their being formed by the patterning method.

In the second embodiment of the semiconductor device package according to the present invention, the plated bumps are formed by electroplating metal patterns while using a photoresist as a mask. By controlling the thickness of the photoresist, the height of the plated bumps can be made uniform. Furthermore, the height of the plating bumps can be 50 μm or less, so that the semiconductor device package itself can have an overall thickness of only 534~675 μm. That is, the semiconductor device package according to the present invention can be thinner than other semiconductor device packages using conventional solder bumps.

Although preferred embodiments of the present invention have been described in detail hereinabove, it should be clear that many variations and/or modifications of the basic inventive concepts herein taught will appear to those of ordinary skill in the art. Accordingly, all such variations and/or modifications are seen to fall within the spirit and scope of the present invention as defined by the appended claims.

What is claimed is:

1. A method of manufacturing a semiconductor package, said method comprising the steps of:

preparing a board which has an upper surface and a lower surface, a chip mounting area and circuit patterns at said upper surface, and metal pads at said lower surface, said circuit patterns being disposed around said chip mounting area, and said metal pads being electrically connected to said circuit patterns;

providing a discrete plate of metal having a thickness;

subsequently physically setting the metal plate atop said lower surface over said metal pads and attaching the metal plate over said lower surface of the board, whereby the attached metal plate covers said metal pads;

with said metal plate covering said metal pads, removing by etching portions of said metal plate located to the sides of said metal pads and thereby leaving remaining portions of the metal plate on said metal pads so as to form metal patterns on said metal pads, each of the metal patterns having a top surface, a bottom surface resting on a respective one of the metal pads, and a side surface extending downwardly from the top surface to the bottom surface thereof, the metal patterns each having a height corresponding to the thickness of said metal plate;

subsequently plating both the top and the side surfaces of said metal patterns, to form metal bumps, with a material that prevents the metal patterns from oxidizing and facilitates the ability of the bumps to be mounted to external electronics;

attaching a semiconductor chip to the chip mounting area at the upper surface of the board;

bonding the semiconductor chip to the circuit patterns with bonding wires; and encapsulating the semiconductor chip, the circuit patterns, and the bonding wires to form a package body.

2. A method of manufacturing a semiconductor device package as claimed in claim 1, wherein said step of attaching a metal plate comprises attaching a plate made of Cu over the lower surface of the board.

3. A method of manufacturing a semiconductor device package as claimed in claim 2, wherein said step of plating comprises plating the metal patterns with solder.

4. A method of manufacturing a semiconductor device package as claimed in claim 3, wherein said step of plating comprises plating the metal patterns with a solder to a thickness of 5.08 to 25.4 μm.

5. A method of manufacturing a semiconductor device package as claimed in claim 2, wherein said step of plating comprises plating the metal patterns with a Ni/Au alloy.

6. A method of manufacturing a semiconductor device package as claimed in claim 5, wherein said step of plating comprises plating the metal patterns with a Ni/Au alloy to a thickness of 5.08 to 25.4 μm.

7. A method of manufacturing a semiconductor device package as claimed in claim 1, wherein said step of removing by etching portions of said metal plate comprises:

coating the metal plate with a photoresist;

exposing and developing the photoresist to form openings therein which expose portions of the metal plate located to the sides of the metal pads;

etching the portions of the metal plate which are exposed by the openings in the photoresist; and subsequently removing remaining portions of the photoresist.

8. A method of manufacturing a semiconductor device package as claimed in claim 1, further comprising a step of coating the entire lower surface of the board, except at the metal patterns, with a solder resist after said step of removing by etching portions of the metal plate is carried out.

9. A method of manufacturing a semiconductor device package as claimed in claim 1, wherein said step of providing a plate of metal comprises providing a plate of metal having a thickness of 0.2~0.8 mm.

10. A method of manufacturing a semiconductor device package as claimed in claim 1, wherein said step of setting the metal plate atop the lower surface of the board and attaching the metal plate to the lower surface comprises a thermocompression process.

* * * * *